US011411371B1

(12) United States Patent
Doerr et al.

(10) Patent No.: US 11,411,371 B1
(45) Date of Patent: *Aug. 9, 2022

(54) CARRIER SWEEP-OUT IN A TUNABLE LASER

(71) Applicant: Acacia Communications, Inc., Maynard, MA (US)

(72) Inventors: Christopher Doerr, Middletown, NJ (US); Li Chen, Edison, NJ (US); Long Chen, Marlboro, NJ (US)

(73) Assignee: Acacia Communications, Inc., Maynard, MA (US)

( * ) Notice: Subject to any disclaimer, the term of this patent is extended or adjusted under 35 U.S.C. 154(b) by 7 days.

This patent is subject to a terminal disclaimer.

(21) Appl. No.: 16/927,506

(22) Filed: Jul. 13, 2020

Related U.S. Application Data

(63) Continuation-in-part of application No. 15/938,398, filed on Mar. 28, 2018, now Pat. No. 10,714,894, which is a continuation-in-part of application No. 15/857,997, filed on Dec. 29, 2017, now Pat. No. 10,554,014.

(60) Provisional application No. 62/447,513, filed on Jan. 18, 2017.

(51) Int. Cl.
  *H01S 5/14* (2006.01)
  *H01S 5/12* (2021.01)
  *H01S 5/32* (2006.01)
  *H01S 5/02* (2006.01)

(52) U.S. Cl.
  CPC .............. *H01S 5/142* (2013.01); *H01S 5/021* (2013.01); *H01S 5/124* (2013.01); *H01S 5/32* (2013.01)

(58) Field of Classification Search
  CPC .... H01S 5/021; H01S 5/02453; H01S 5/0612; H01S 5/06246; H01S 5/0683; H01S 5/142
  See application file for complete search history.

(56) References Cited

U.S. PATENT DOCUMENTS

| | | | |
|---|---|---|---|
| 6,345,062 B1 | 2/2002 | Taguchi | |
| 7,489,439 B2 | 2/2009 | Kuo | |
| 8,295,655 B2 | 10/2012 | Manipatruni | |
| 10,714,894 B1 * | 7/2020 | Doerr | H01S 5/06246 |
| 2002/0140054 A1 | 10/2002 | Matsushita | |
| 2002/0153039 A1 | 10/2002 | Moon | |
| 2009/0122817 A1 * | 5/2009 | Sato | G02B 6/12007 372/20 |
| 2010/0044676 A1 | 1/2010 | Sargent | |
| 2012/0171804 A1 | 7/2012 | Moslehi | |

(Continued)

OTHER PUBLICATIONS

Rong et al., "Low-threshold continuous-wave Raman silicon laser," Nature Photonics, vol. 1, pp. 232-237, 2007.

(Continued)

*Primary Examiner* — Michael Carter
(74) *Attorney, Agent, or Firm* — Joseph D'Angelo

(57) ABSTRACT

In a first embodiment, an external cavity tunable laser, comprising a silicon photonics circuit comprising one or more resonators having one or more p-i-n junctions; wherein a voltage is applied to one or more of the p-i-n junctions. In a second embodiment, a method of operating an external cavity tunable laser, comprising sweeping out free-carriers from a resonator of the tunable laser by applying a voltage to a p-i-n junction of a waveguide of the resonator.

17 Claims, 12 Drawing Sheets

(56) References Cited

U.S. PATENT DOCUMENTS

2015/0212346 A1 7/2015 Zheng
2017/0222398 A1 8/2017 Zilkie

OTHER PUBLICATIONS

Gajda et al., "Design rules for p—i—n diode carriers sweeping in nano-rib waveguides on SOI," Optics Express, vol. 19, No. 10, pp. 9915-9922, 2011.

Kobayashi et al., "Silicon Photonic Hybrid Ring-Filter External Cavity Wavelength Tunable Lasers," Journal of Lightwave Technology, vol. 33, No. 6, pp. 1241-1246, 2015.

\* cited by examiner

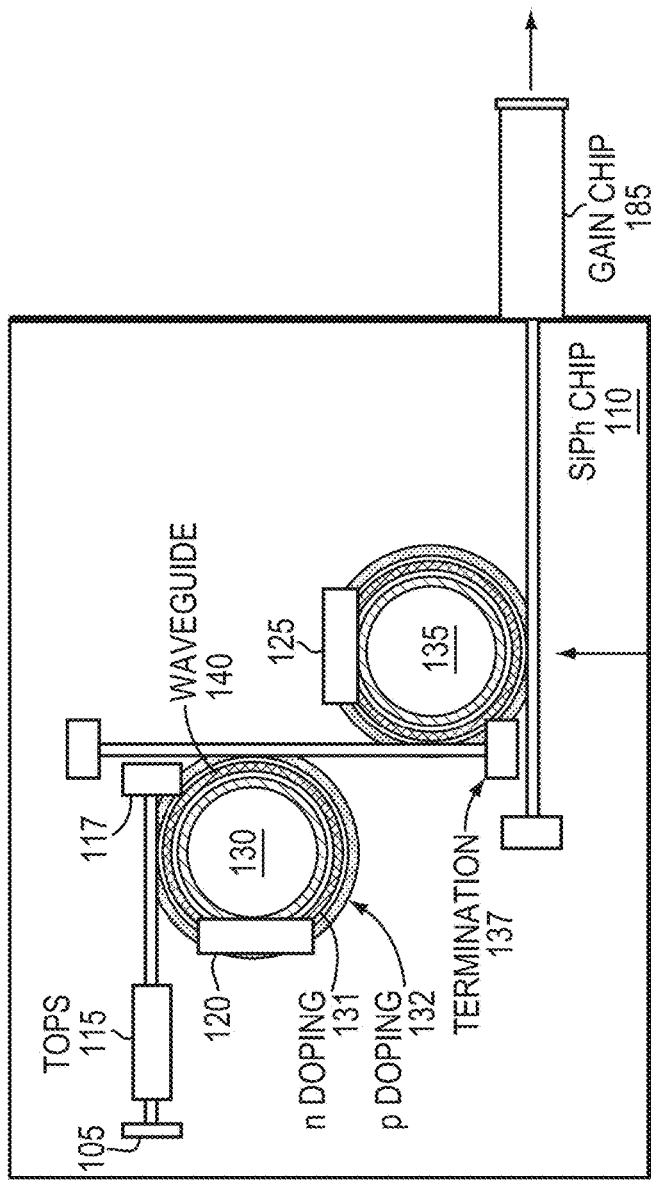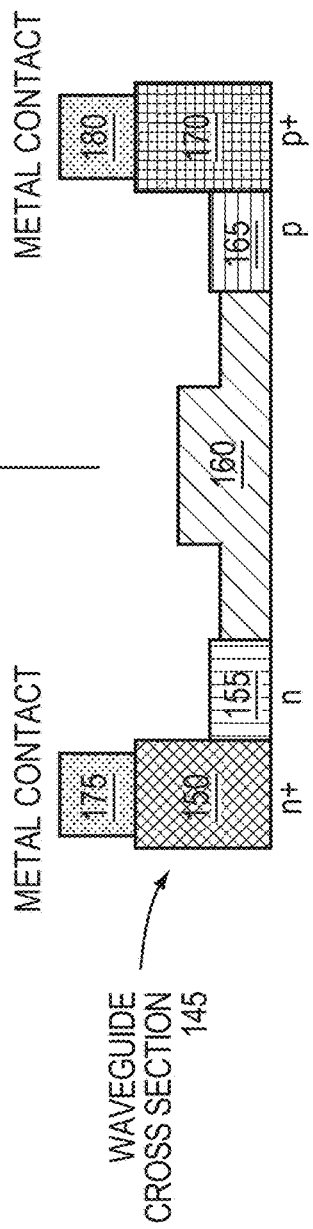
FIG. 1A
FIG. 1B

CARRIER SWEEP-OUT IN A TUNABLE LASER

RELATED APPLICATIONS AND PRIORITY

The present application is a Continuation-in-Part of U.S. patent application Ser. No. 15/938,398 filed Mar. 28, 2018 entitled "Carrier Sweep-Out In A Tunable Laser," which claims the benefit of U.S. Provisional Patent Application Ser. No. 62/447,513 filed Mar. 28, 2017 entitled "Carrier Sweep-Out In A Tunable Laser," both of which are hereby incorporated herein by reference in their entirety.

The present application is a Continuation-in-Part of U.S. patent application Ser. No. 15/938,398 filed Mar. 28, 2018 entitled "Carrier Sweep-Out In A Tunable Laser," which is a Continuation-in-Part of U.S. patent application Ser. No. 15/857,997 filed Dec. 29, 2017, now U.S. Pat. No. 10,554,014 issued Feb. 4, 2020, entitled "Shorted P-N Junction," both of which are hereby incorporated herein by reference in their entirety.

BACKGROUND

A photonic integrated circuit usually includes optical components integrated on a substrate.

BRIEF DESCRIPTION OF THE FIGURES

Various aspects and embodiments of the application are described with reference to the following figures. It should be appreciated that the figures are not necessarily drawn to scale.

FIG. 1a is a simplified illustration of a tunable laser, in accordance with an embodiment of the present disclosure;

FIG. 1b is a simplified illustration of a cross section of p-i-n junction, in accordance with embodiments of the present disclosure;

SUMMARY

Figure 2:
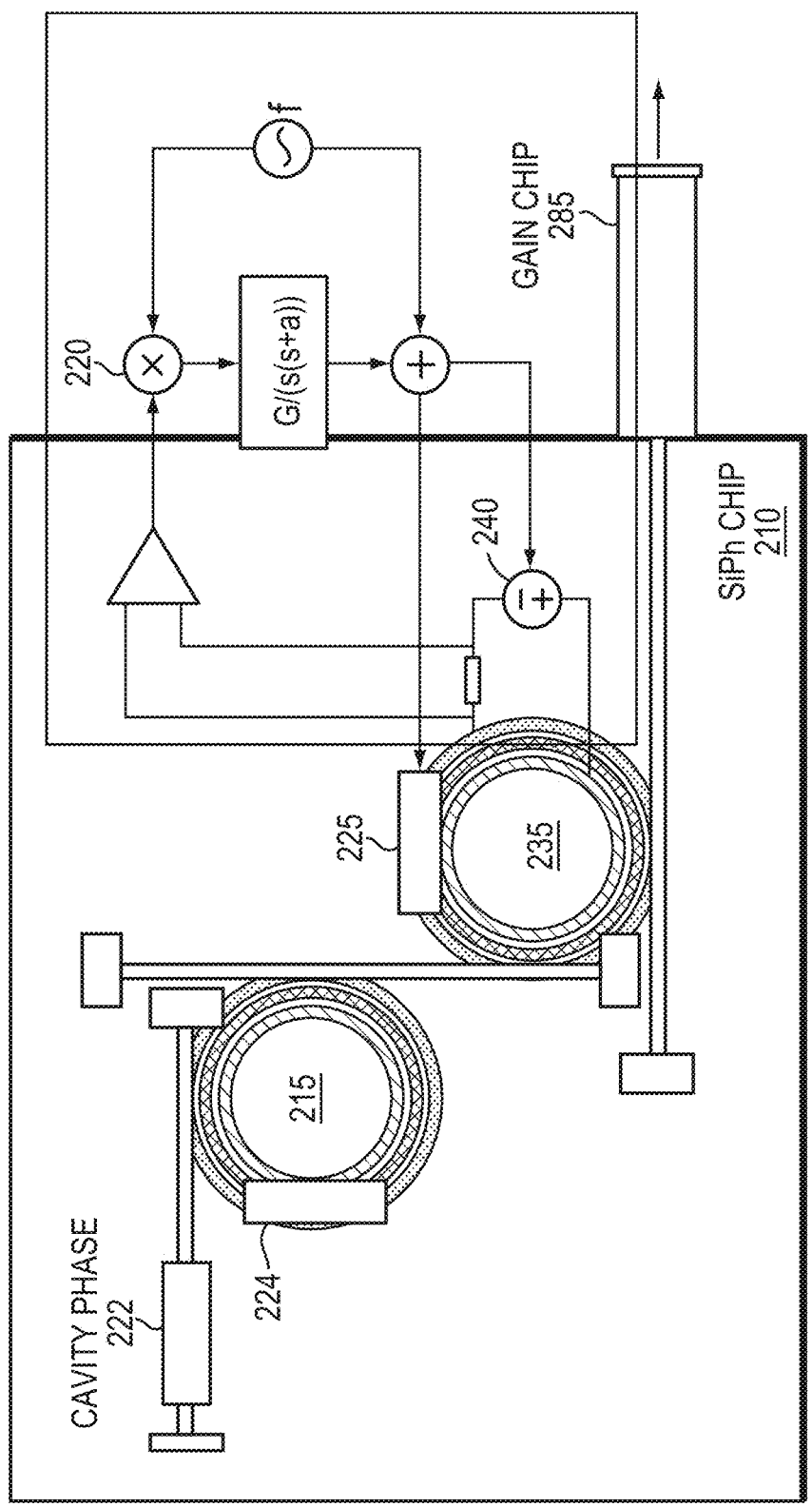
FIG. 2 is a simplified illustration of a control loop schematic that uses a thermo-optic phase shifter (TOPS) to lock a resonator to a lasing wavelength, in accordance with an embodiment of the present disclosure.

In a first embodiment, an external cavity tunable laser, comprising a silicon photonics circuit comprising one or more resonators having one or more p-i-n junctions; wherein a voltage is applied to one or more of the p-i-n junctions. In a second embodiment, a method of operating an external cavity tunable laser, comprising sweeping out free-carriers from a resonator of the tunable laser by applying a voltage to a p-i-n junction of a waveguide of the resonator.

DETAILED DESCRIPTION

In certain embodiments, the current disclosure appreciates that when high optical power is introduced to a waveguide or ring resonator, the high optical power may cause undesired effects. In some embodiments, the current disclosure has realized that high optical power may heat a waveguide or resonator through optical absorption. In most embodiments, high optical power may cause a shift in lasing frequency in a waveguide inside a laser cavity through increased heat. In most embodiments, high optical power may cause a shift in a resonant frequency in a resonator waveguide through increased heat. In certain embodiments, high optical power may lead to hysteresis and stability problems in a tunable laser. In some embodiments, with a resonator optical power may be enhanced at resonant wavelengths, which may make the ring resonator susceptible to nonlinear effects. In many embodiments herein, a resonator may be a ring resonator, a Fabry-Perot resonator, or a photonic crystal resonator. As used herein, examples may be given with respect to a specific type of resonator, such as a ring resonator, but one or more of the techniques and/or implementations herein may be used with other resonators including, but not limited to Fabry-Perot resonators and photonic crystal resonators.

In some embodiments, when high optical power is sent into a waveguide or ring resonator made of semiconductors, there may be two-photon absorption (TPA). In many embodiments, TPA due to high optical power may generate free electrons and holes (free carriers) which may lead to more optical absorption if the free carriers are not removed or recombined, named as free carrier absorption (FCA). In many embodiments, if one or more resonators are used as part of a laser, then the aforementioned limitations may impact the laser.

In certain embodiments, it may be possible to construct an external-cavity tunable laser by combining an InP gain chip and a silicon chip containing resonators. In some embodiments, because of field enhancement in the ring resonator, it may have an optical power high enough to cause significant TPA.

In certain embodiments, heating of a resonator may shift a resonance frequency of the resonator. In most embodiments, optical-power-dependent resonance shifting may make a tunable laser unstable and difficult to control. In many embodiments, an external cavity tunable laser using silicon photonics with resonators as the external cavity may be prone to significant nonlinear optical absorption in the resonators, even at low laser output powers. In almost all embodiments, the process of TPA-FCA-heat may make the laser difficult to control and may be highly undesirable.

In some embodiments, a concentration of free carriers in the waveguide at equilibrium may depend on two factors. In many embodiments, concentration of free carriers may be proportional to the rate of generation, or to the square of the optical power in the resonator in the process of TPA; and the concentration may be proportional to the carrier lifetime, which may measure how long the carriers stay after generation before they recombine or are removed. In most embodiments, to reduce the impact of FCA and heat, the optical power inside the resonator may be reduced and/or the carrier lifetime may be shortened.

Consider a particular embodiment of a laser with ring resonators. In the particular embodiment, a TPA coefficient for silicon at 1550 nm wavelength is ~0.5 cm/GW. For this particular embodiment at an output power of 50 mW, there may be 500 mW inside the ring resonator. In this particular embodiment, for a mode width and height of 800 and 200 nm, respectively, this gives a TPA of 0.68 dB/cm, which may not be particularly high absorption for some applications. In this particular embodiment, the resonator would generate a free-carrier concentration of about $3.8 \times 10^{17}$ cm$^{-3}$, assuming the carrier lifetime in silicon is 1 ns. In this particular embodiment, the carrier concentration results in an absorption of ~24 dB/cm. In this particular embodiment, this is ~0.6 dB per round trip in a 40-μm-radius ring, which means ~65 mW of optical power is converted to heat in the ring. In this particular embodiment, this can heat the ring by hundreds of degrees Celsius, causing a large frequency resonance shift.

In some embodiments, a method to avoid the power-dependent resonance shifting in an external cavity tunable laser may be to run a laser at a low optical power level and have a booster optical amplifier after the laser to obtain high output power. In most embodiments, running a laser at a low power may involves integration of a second InP element. In many embodiments, use of a second InP element may cause a lack of a practical integrated optical isolator, which may require the booster optical amplifier must have extremely low facet reflectivities.

In other embodiments, another method to avoid the power-dependent resonance shifting in an external cavity tunable laser may be to shorten the free carrier lifetime. In some embodiments, in silicon, there may be several different approaches. In an embodiment, the rate of carrier recombination may be increased to avoid power dependent-resonance shifting. In a particular embodiment, defects may be created inside the silicon as recombination centers, or a waveguide's dimensions may be reduced so that surface recombination becomes more dominant. In some embodiments, increasing the rate of carrier recombination, creating defects in silicon, or reducing a waveguide's dimensions, may have negative consequence on the optical propagation loss of the waveguide and thus may be undesirable for lasers. In another embodiment, build a p-i-n junction may be built across a waveguide and carriers may be swept out quickly. In a particular embodiment, a carrier lifetime in sub-micrometer silicon waveguides may be reduced from approximately 1 ns to below 20 ps with the assist of a p-i-n junction. In some embodiments, the free carrier concentration may be reduced by a factor of 50. In the aforementioned embodiment, the FCA is reduced from 24 dB/cm to below 0.5 dB/cm.

In many embodiments, a waveguide or ring resonator may include one or more n-type and p-type semiconductors. Typically, in an n-type semiconductor, the majority of carriers are electrons and the minority of carriers are holes. Conventionally, an n-type semiconductors is fabricated by doping a semiconductor with impurities such as phosphorus. In many embodiments, it may be possible to distinguish between an n+ type semiconductor and an n++ type semiconductor by the amount of doping material used when fabricating the n type semiconductor. In certain embodiments, an n+ doping may be 5 times 10 to the 18$^{th}$ per cubic centimeter of phosphorus. In certain embodiments, an n++ doping may be 1 times 10 to the 20$^{th}$ per cubic centimeter of phosphorus.

Generally, in p-type semiconductors, the majority of carriers are holes and the minority of carriers are electrons. Typically, p-type semiconductors are fabricated by doping a semiconductor with impurities such as boron. In many embodiments, it may be possible to distinguish between a p+ type semiconductor and a p++ type semiconductor by the amount of doping material used when fabricating the n type semiconductor. In certain embodiments, a p+ doping may be 5 times 10 to the 18$^{th}$ per cubic centimeter of boron. In certain embodiments, a p++ doping may be 1 times 10 to the 20$^{th}$ per cubic centimeter of boron.

In most embodiments of the current disclosure, a junction between a p-type semiconductor material and an n-type semiconductor material may be used to eliminate or substantially reduce the concentration of free carriers. In certain embodiments, a p-i-n junction may be used on ring resonators to sweep out photo-generated carriers, eliminating nonlinearity. In certain embodiments, a junction may include p and n elements. In certain embodiments, a junction may include p+ and n+ elements. In other embodiments, a junction may include p++ and n++ elements. In further embodiments, a junction may include and combination of p++, p+, p, n, n+, and n++ dopings.

In some embodiments, a junction between a p-type material and an n-type material may be a short. In other embodiments, a junction between a p-type material and an n-type material may include application of a voltage or reverse bias. In further embodiments, current from TPA-generated carriers in a junction between a p-type material and an n-type material may be used as a feedback signal to lock a ring resonator to a laser wavelength. In certain embodiments, when a ring resonance is centered on the lasing wavelength, optical power may be the highest possible in the ring, which may result in a highest possible current in a p-i-n junction. As used herein, a p-i-n junction may refer to any combination of p-type and n-type dopings.

In some embodiments herein, an external cavity tunable laser using silicon photonics with ring resonators as the external cavity may use a reverse-biased p-i-n junction around waveguides in ring resonators of the laser. In certain embodiments herein, a control loop may be paired with an external cavity tunable laser using silicon photonics with ring resonators as the external cavity may use a p-i-n junction across the waveguides in ring resonators of the laser. In many embodiments, a cavity of a laser may be formed by an InP gain chip connected to a silicon photonics external cavity with multiple ring resonators. In certain embodiments, a laser may have Vernier tuning. In different embodiments, a laser may have different number of ring resonators. In some embodiments, a waveguide may be a rib waveguide. In some embodiments, a waveguide may be a slab. In many embodiments, a waveguide may be other than a channel waveguide. In some embodiments, a slab waveguide may be referred to herein as a rib-waveguide. In certain embodiments, use of a rib-waveguide may allow for positioning of doping far from an optical mode, such that optical loss can be limited. In many embodiments, doping far from an optical mode may be about 0.6 um from the nearest side wall.

In many embodiments, a ring resonator on a silicon photonics chip may serve as part of an external cavity of a tunable laser, where a p-i-n junction of a waveguide of the ring resonator may be used to sweep out the free carriers quickly. In some embodiments, a p-i-n junction may be reverse biased. In other embodiments a p-i-n junction may be zero biased. In further embodiments, a p-i-n junction may be a small forward bias below a junction built-in potential. In many embodiments, the free carriers may be swept out faster when a reverse bias is applied. In certain embodiments, a reverse bias may include applying negative voltage to a p portion of a p-i-n junction and a positive voltage to an n portion of a p-i-n junction. In other embodiments, a reverse bias may indicate that a voltage difference between an n type semiconductor and a p type semiconductor is positive. In certain embodiments, when a junction is reverse biased, the free carriers may be swept out of a waveguide. In most embodiments, sweeping out free carriers may keep carrier density low in a waveguide, which may keep an absorption loss low and may eliminate power-induced resonance shift.

In most embodiments, different control loops may be used to provide feedback to a laser. In a first embodiment, a thermo-optic phase shifter (TOPS) may be used on one or more rings of a resonator and a periodic signal at a given frequency may be applied to a TOPS at one or more of the rings. In certain embodiments, a periodic signal may be applied at a same frequency to each ring resonator. In some embodiments, a periodic signal may be applied in a round robin manner. In other embodiments, a different frequency may be applied for each ring resonator. In further embodiments, each ring resonator may be controlled simultaneously.

In an alternative embodiment, voltage used across a p-i-n junction may be varied to enable free-carrier absorption to heat a ring resonator in a controllable manner without the use of a TOPS. In further embodiments, a cavity phase may be used to lock a lasing wavelength to a ring and a ring may be tuned to lock a target wavelength using a TOPS and feedback look. In a further embodiment, a control loop may be used to control power in a laser and adjust gain to hold a p-i-n junction to a target value. In some embodiments, a control loop may be given by the equation $G/(s(s+a))$ where G is the gain of the feedback loop, a is a pole of the feedback response, and S is equal to $i2\pi f$, where i is the imaginary number and f is the frequency.

Refer now to the example embodiment of FIGS. 1a and 1b, which illustrate an external cavity tunable laser using silicon photonics with ring resonators as the external cavity, in which a reverse-biased is applied to a p-i-n junction around the waveguides in the ring resonators. In this example embodiment, the laser cavity is formed by an InP gain chip connected to a silicon photonics external cavity with multiple ring resonators giving Vernier tuning. In this example embodiment, there are TOPS 115, 120, and 125. The example embodiment of FIG. 1a shows two rings, Ring 130 and 135. Each ring has a p doping and an n doping as shown by n doping 131 and p doping 132. Each Ring also includes a waveguide, such as waveguide 140. The TOPS, waveguides, dopings, and rings all sit on silicon photonics chip 110. Coupled to silicon photonics chip is gain chip 185. In FIG. 1a there are two rings, but in other embodiments there may be any number of rings such as one or five. Waveguide termination points, such as waveguide termination point 117, handle the left-over light at the waveguide without causing notable back reflections. To the left of TOPS 115 is a high-reflectivity mirror 105 that reflects the light back to the cavity. In certain embodiments, with Vernier tuning, there may be two resonators with slightly different free-spectral ranges. In these certain embodiments, these resonators may look like combs with slightly different periods. In these certain embodiments, different teeth on the comb may be lined up by shifting one of the combs. In these embodiments, Vernier tuning may allow a large tuning range by tuning two elements over a small tuning range.

Referring now to the example embodiment of FIG. 1b, cross section 145 of a p-i-n junction is illustrated. In this embodiment, waveguide 160 is surrounded by n 155 doped semiconductor and p doped semiconductor 165. P semiconductor 165 is abutted by p+ semiconductor 170. N semiconductor 155 is abutted by n+ semiconductor 150. N+ semiconductor 150 is connected to metal contact 175. P+ 175 semiconductor is connected to metal contact 180. Metal contacts 180 and 175 are where the reverse bias may be applied. In other embodiments, there may be different combinations of one or more p-type semiconductors and n-type semiconductors. In the example embodiments of FIGS. 1a and 1b, the waveguides are rib waveguides. In certain embodiments, a rib-waveguide ring resonators on a silicon photonics chip may serve as an external cavity of a tunable laser.

Refer now to the example embodiment of FIG. 2, which illustrates a control loop with a thermo-optic phase shifter on each resonator ring. In this example embodiment, as in FIG. 1, each ring resonator has a bias voltage applied across a p-i-n junction for the resonator. For example, bias voltage 240 is applied to the p-i-n junction of ring resonator 235. As well, a periodic signal at frequency f is applied to TOPS 225 of resonator ring 235 by control loop 220 to drive the power of TOPS 225 to maximize the current coming from the p-i-n junction to lock the lasing wavelength. In this embodiment, when the ring resonant frequency is aligned to the lasing wavelength the power in the ring will be at a maximum. In this example embodiment, f is the same frequency for each ring. In other embodiments, each ring resonator may be controlled in a round-robin fashion. In further embodiments, a different frequency may be used for each ring. Referring back to the example embodiment of FIG. 2, by using demodulated detection of the p-i-n junction current and then filtering and integrating it to drive the TOPS power to maximize the current coming from the p-i-n junction, the ring resonance wavelength locks to the lasing wavelength. In other embodiments, instead of using dithering and demodulation, other control schemes may be used including the hill climbing method.

Figure 3:
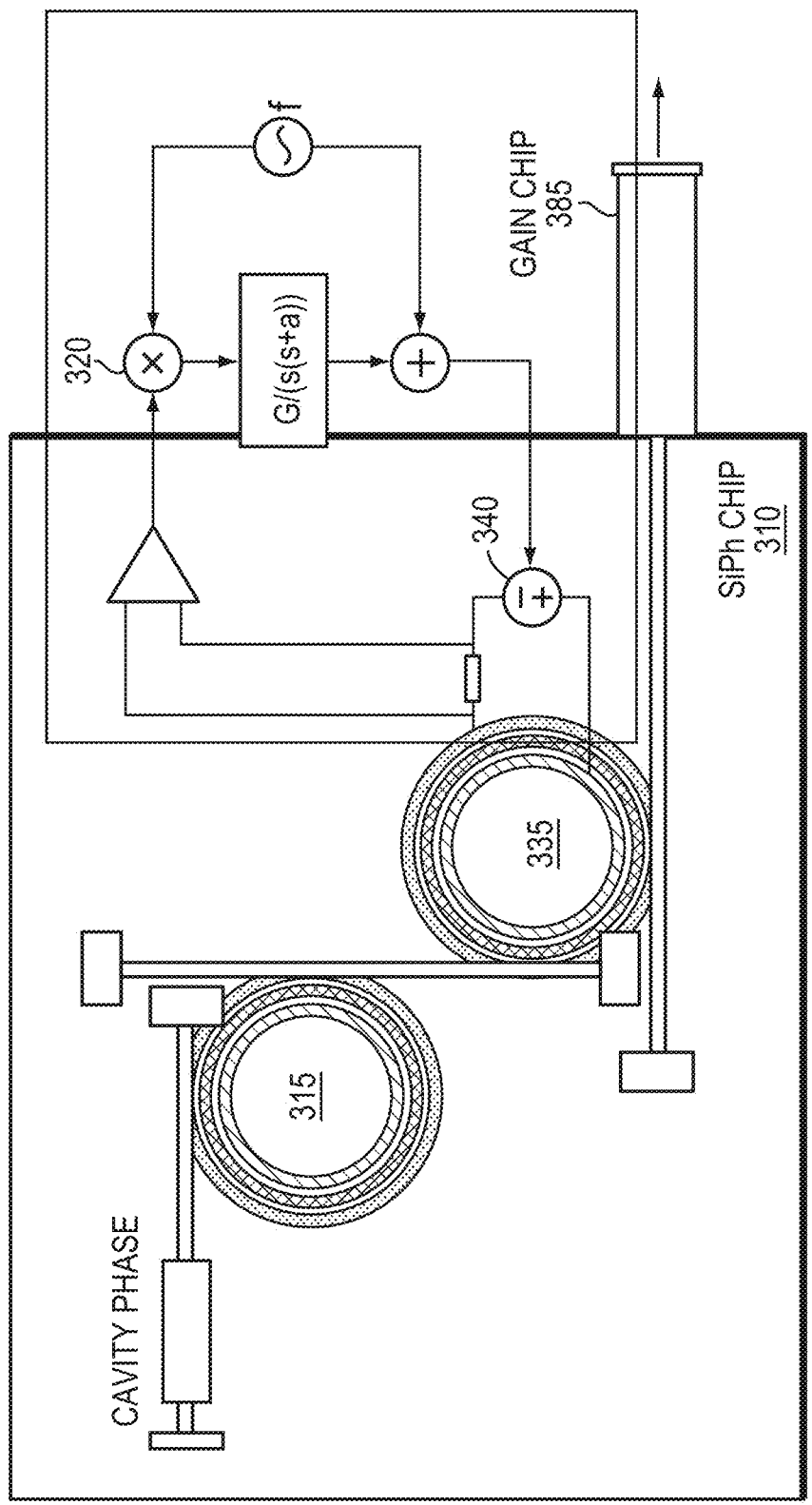
FIG. 3 is a simplified illustration of a control loop schematic that uses a reverse bias voltage to lock a resonator to a lasing wavelength, in accordance with an embodiment of the present disclosure.

The example embodiment of FIG. 3 illustrates an alternative control loop to tune one or more ring resonators. In the example embodiment of FIG. 3, control loop 320 adjusts voltage 340 applied to a p-i-n junction of ring resonator 335 to tune the ring resonator frequency. In the example embodiment, reducing the voltage applied to a ring resonator, such as ring resonator 335, increases free carrier absorption and increasing the voltage reduces the free carrier absorption. In this embodiment, increasing free carrier absorption increases the heat of the ring resonator as the free carriers are dissipated into heat. In this example embodiment, changing the bias voltage changes the amount of external electrical power supplied to the junction. In this example embodiment, heating may be achieved without the use of a TOPS. In certain embodiments, where heating is achieved through adjusting of an applied voltage, there may be a temperature stabilization time on the order of 100 μs.

In some embodiments, separate control loops may be provided on each ring resonator in the laser, as shown in FIGS. 2 and 3. In some embodiments, a lasing wavelength may be locked to a wavelength locker by controlling the laser cavity phase. In the example embodiments of FIGS. 2 and 3, each ring resonator is individually locked to the lasing wavelength, and locking the lasing wavelength to a target wavelength is done by controlling the cavity phase.

Figure 4:
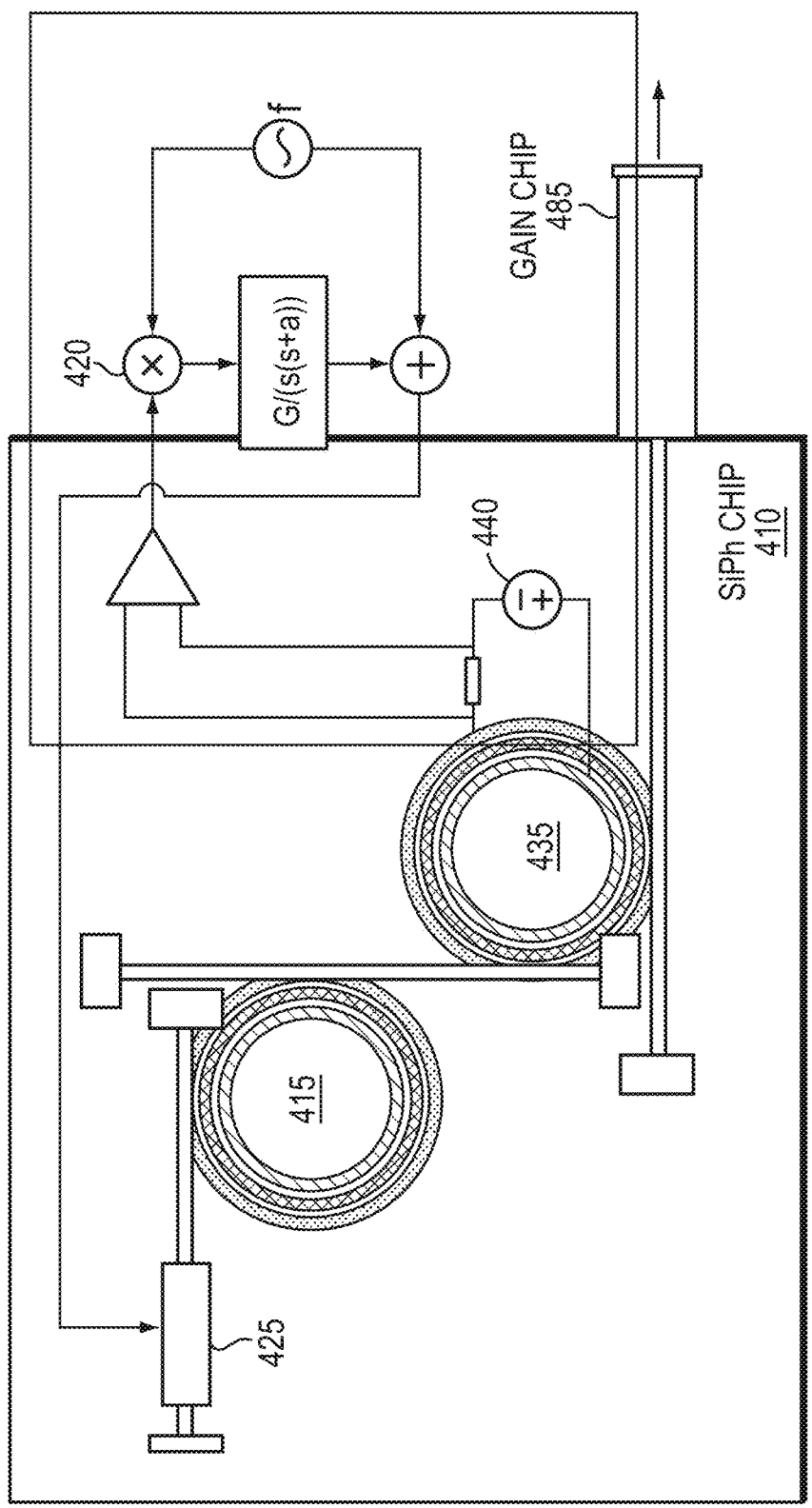
FIG. 4 is a simplified illustration of a control loop schematic which uses a cavity phase TOPS to lock a lasing wavelength to a resonator, in accordance with an embodiment of the present disclosure.

Refer now to the example embodiment of FIG. 4, which illustrates a control loop to use a cavity phase to lock the lasing wavelength on a ring resonator. In the example embodiment of FIG. 4, bias voltage 440 is applied to ring resonator 435. The bias voltage is fed to control loop 420 which inputs to dithered cavity phase 425 to lock the lasing wavelength to ring resonator 425.

Figure 5:
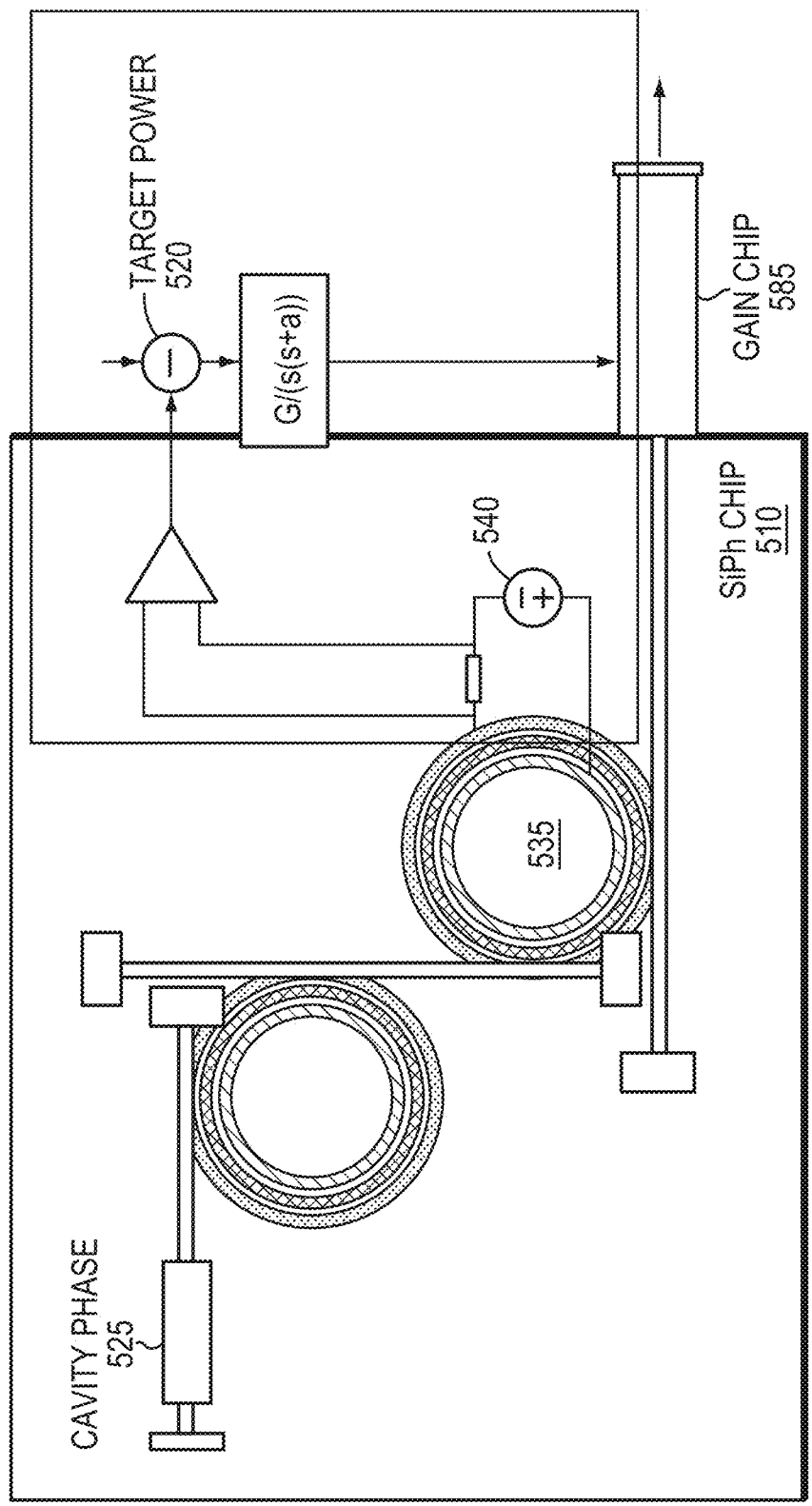
FIG. 5 is a simplified illustration of control loop schematic which uses a reverse junction current to control laser power, in accordance with an embodiment of the present disclosure.

Refer now to the example embodiment of FIG. 5, which illustrates using a bias voltage and control loop to control the power of a laser. In the example embodiment of FIG. 5, bias voltage 440 is applied to ring resonator 535. Control loop 520 feeds into gain chip 585 to control the power of the laser. In this embodiment, control loop 520 the current to gain chip 585 to hold the p-i-n junction current to a target value.

Figure 6:
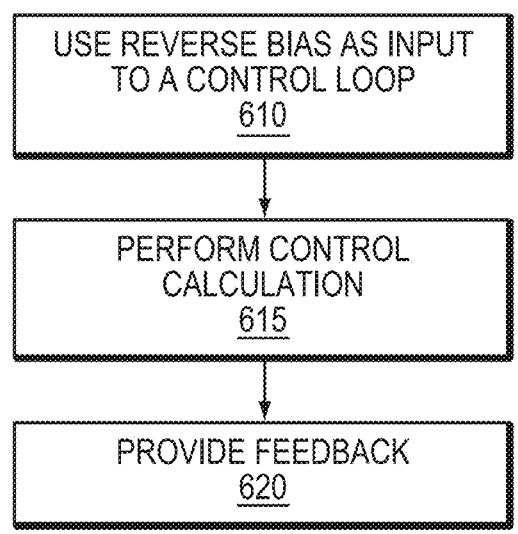
FIG. 6 is a simplified illustration of a method of the current disclosure, in accordance with an embodiment of the present disclosure.

Refer now to the example embodiment of FIG. 6, which illustrates a simplified sample method of the current disclosure. A voltage is input to control loop 610. The control loop performs a calculation on the input value (step 615). Based on the calculation, the control loop provides feedback (step 620). In some embodiments, one or more of the control loops discussed herein may be implemented in analog circuitry. In many embodiments, one or more of the control loops discussed herein may be implemented in digital logic. In certain embodiments, a control loop may be implemented on a silicon photonics chip. In other embodiments, a control loop may be implemented external to a silicon photonics chip. In some embodiments, a control loop may use a dithered TOPS to lock a ring resonator to a lasing wavelength. In other embodiments, a control loop may use a dithered reverse bias voltage to lock a ring resonator to a lasing wavelength. In further embodiments, a control loop may use a dithered cavity phase TOPS to lock a lasing wavelength to a ring resonator. In certain embodiments, a control loop may use a reverse junction current to control a laser power. In other embodiments, a hill climbing algorithm may be used in place of dithering.

Figure 7:
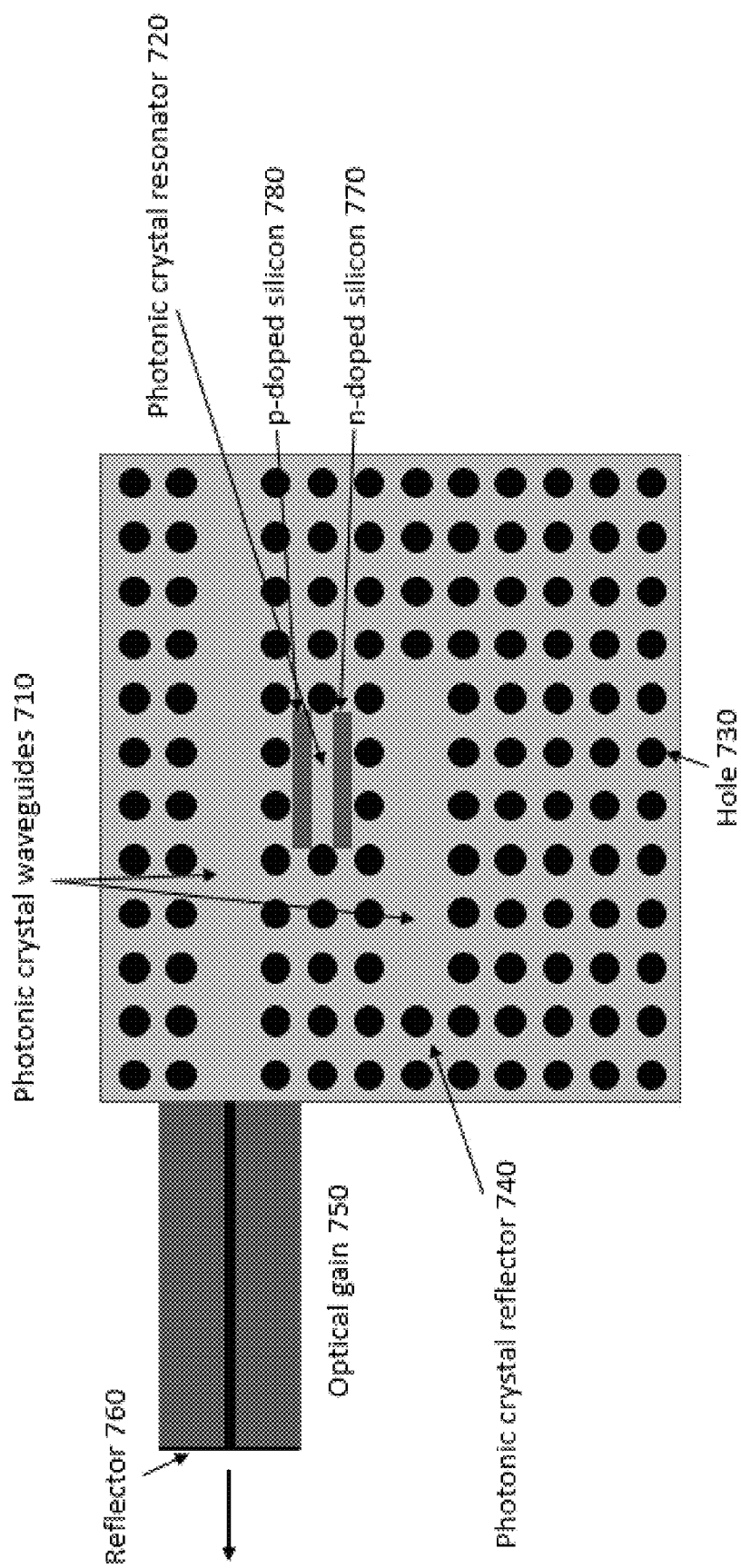
FIG. 7 is a simplified illustration of a tunable laser structure employing photonic crystal waveguides and resonators, in accordance with an embodiment of the present disclosure.

In some embodiments, the instant disclosure may enable a high-power tunable laser using resonators as tuning elements without instabilities from nonlinear absorption, and enables a sensitive feedback signal for controlling the wavelength and power of the tunable laser. Refer now to the example embodiment of FIG. 7, which shows a tunable laser structure employing photonic crystal waveguides and resonator. Photonic crystal waveguides 710 and resonator 720 consist of defects in a 2D photonic crystal. The 2D photonic crystal consists of a lattice of elements in a high-refractive index material, such as silicon, such that it provides a bandgap in all or nearly all directions in two dimensions. In the example of FIG. 7, the elements are holes, such as hole 730. The waveguides are a path of missing holes. The light is guided along this path since it is not possible for it to enter the crystal. The photonic crystal resonator 720 is a small confined region of missing holes. The photonic crystal in FIG. 7 has a square lattice, but in other embodiments any type of lattice may be used. Referring back to FIG. 7, photonic crystal waveguides 710 are connected to optical gain medium 750. The optical gain medium has a reflector 760, which is a mirror on the end face. Photonic crystal waveguide couples to resonator 720. Photonic crystal resonator 720 is coupled to another photonic crystal waveguide which terminates, which acts as a reflector. In many embodiments, as a photonic crystal has a bandgap in all directions (in 2D), it reflects all light that tried to enter it and by ending a waveguide, all light is reflected back.

In some embodiments, a p-n junction with an electrical connection may be placed in a photonics crystal resonator, as shown as the p-doped region 780 and n-doped region 770 of the example embodiment of FIG. 7. In some embodiments, a laser cavity phase and/or temperature of a photonics crystal resonator may be adjusted to maximize current or achieve a certain current generated by the p-n junction. In certain embodiments, when current is maximized or a certain current is achieved, light may be on or near resonance of the photonic crystal resonator.

Figure 8:
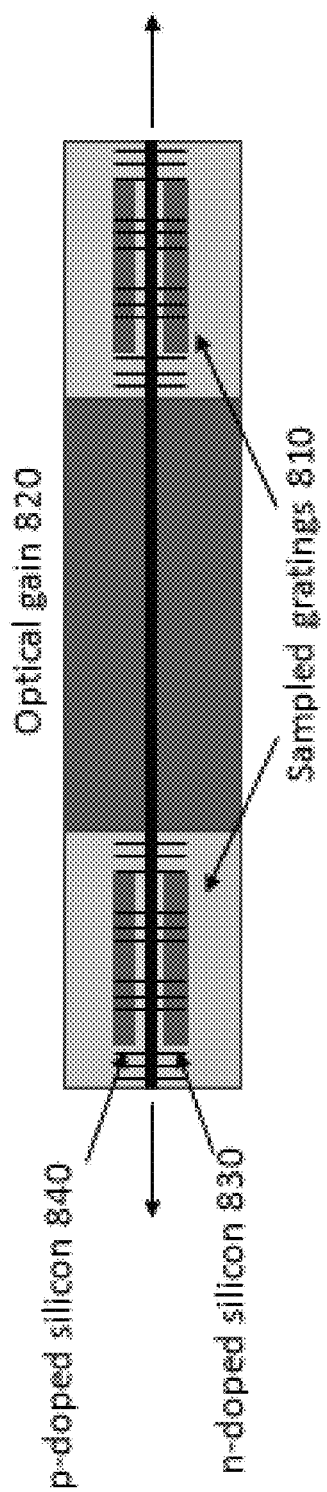
FIG. 8 is a simplified illustration of a tunable laser employing sampled gratings, in accordance with an embodiment of the present disclosure.

Refer now to the example embodiment of FIG. 8, which shows a tunable laser employed sampled gratings. Sampled gratings 810 are Bragg reflector gratings with periodically missing grooves. There is a p-n junction with an electrical connection in one or both of the sampled gratings, with p-doped region 830 and n-doped region 840

In many embodiments, a laser cavity phase and/or temperature of a sampled grating with a p-n junction may be adjusted to maximize the current or achieve a certain current generated by the p-n junction. In some embodiments, when current is maximized or a certain current condition occurs, light in the resonator may be on or near resonance of the sampled grating.

Figure 9A:
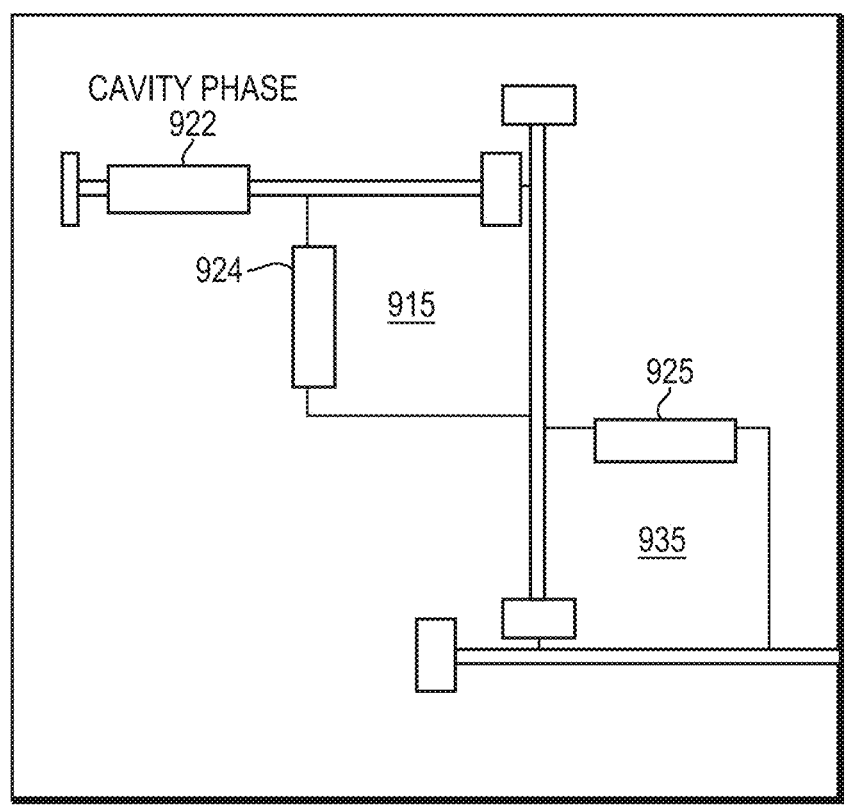
FIGS. 9a and 9b are simplified illustrations of a portion of tunable laser with Fabry-Perot resonators, in accordance with embodiments of the present disclosure.
Figure 9B:
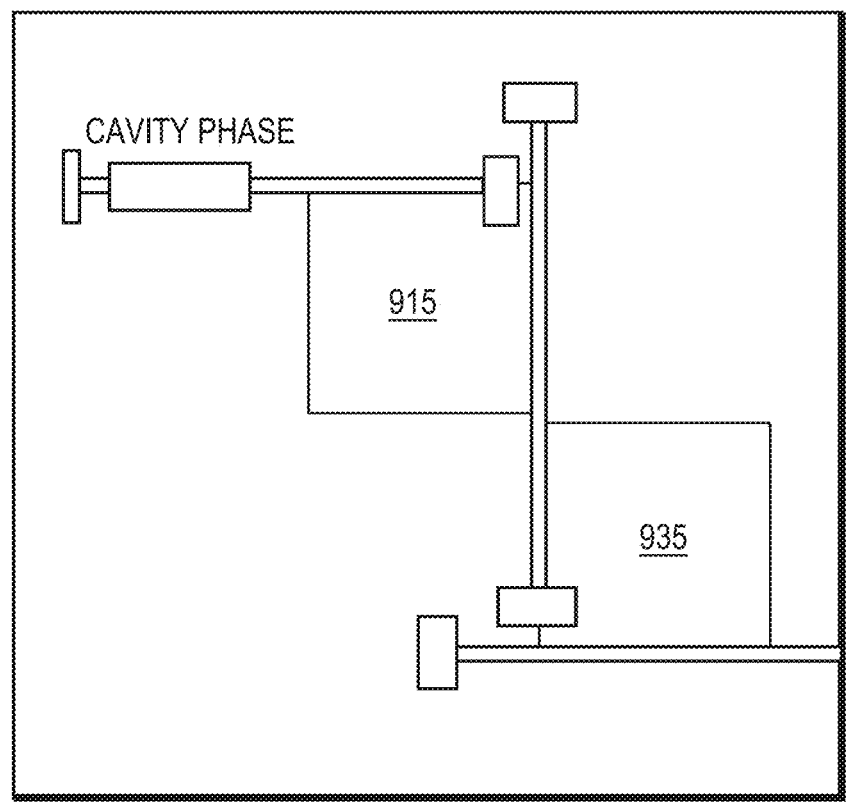

Refer now to the example embodiment of FIG. 9a, which illustrates a control loop with a thermo-optic phase shifter on each Fabry-Perot resonators. In FIG. 9a, tops 924 is on Fabry-Perot resonator 915. Tops 924 is on Fabry-Perot resonator 935. Refer now to the example embodiment of FIG. 9b, which illustrates one or more Fabry-Perot resonators. Fabry-Perot resonator 915 and 935 may be controlled without the use of a TOPS.

Figure 10A:
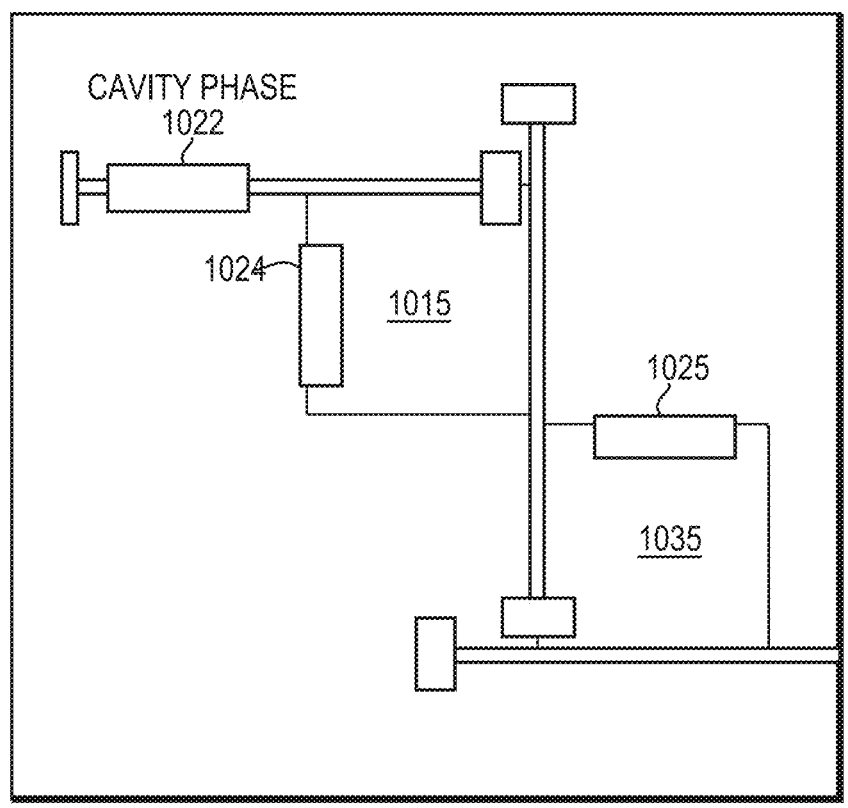
FIGS. 10a and 10b are simplified illustrations of a portion of tunable laser with photonic crystal resonators, in accordance with embodiments of the present disclosure.
Figure 10B:
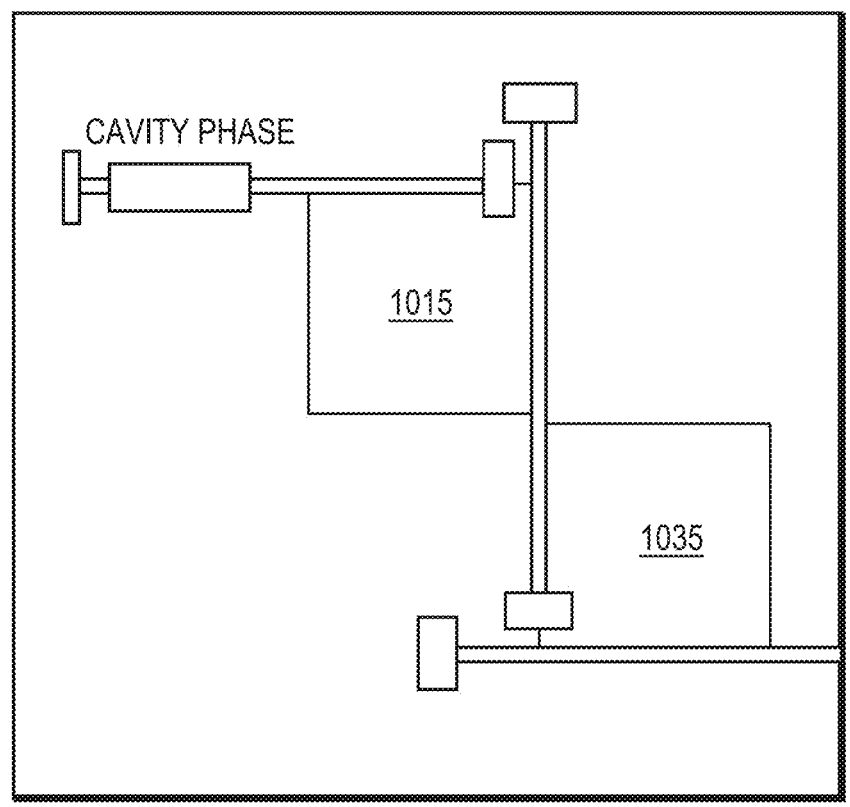

Refer now to the example embodiment of FIG. 10a, which illustrates a control loop with a thermo-optic phase shifter on each photonic crystal resonators. In FIG. 10a, tops 1024 is on photonic crystal resonator 1015. Tops 1024 is on photonic crystal resonator 1035. Refer now to the example embodiment of FIG. 10b, which illustrates one or more photonic crystal resonators. Photonic crystal resonator 1015 and 1035 may be controlled without the use of a TOPS.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. An external cavity tunable laser, comprising:
a silicon photonics circuit comprising one or more resonators having one or more p-i-n junctions; wherein a voltage is applied to one or more of the p-i-n junctions; wherein a reverse junction current is used to control power of the external cavity tunable laser using a control loop; wherein the reverse junction current serves as a feedback signal to enable the control loop to lock at least a resonator of the one or more resonators at a lasing wavelength.

2. The external cavity tunable laser of claim 1, wherein the p-i-n junction is reverse biased.

3. The external cavity tunable laser of claim 1, wherein the resonator includes a slab waveguide.

4. The external cavity tunable laser of claim 1, further comprising a gain chip coupled to the silicon photonics circuit.

5. The external cavity tunable laser of claim 4, wherein the control loop provides feedback for the gain chip.

6. The external cavity tunable laser of claim 1 wherein the control loop is used to control a Thermo-optical phase shifter.

7. The external cavity laser of claim 1 wherein a first resonator of one or more ring resonators is a first crystal photonics resonator, and wherein the silicon photonics circuit further comprises a second crystal photonics resonator; wherein a second control loop controls a voltage applied to a p-i-n junction of the second crystal photonics resonator.

8. The external cavity tunable laser of claim 1, wherein the control loop provides feedback for the cavity of the laser.

9. A method of operating an external cavity tunable laser, comprising:
sweeping out free-carriers from a resonator of the tunable laser by applying a voltage to a p-i-n junction of a waveguide of the resonator; and
using a reverse junction current as an input to a control loop to control power of the external cavity tunable laser; wherein the reverse junction current serves as a feedback signal to enable the control loop to lock at least a resonator of the one or more resonators at a lasing wavelength.

10. The method claim 9, wherein the voltage is a reverse biasing the p-i-n junction of the waveguide of the resonator.

11. The method of claim 9 wherein a first resonator of one or more ring resonators is a first crystal photonics resonator.

12. The method of claim 11 wherein the silicon photonics circuit further comprises a second crystal photonics resonator; wherein a second control loop controls a voltage applied to a p-i-n junction of the second crystal photonics resonator.

13. The method of claim 9 wherein the control loop controls a thermoelectric phase shifter.

14. The method of claim 9 wherein the control loop provides feedback for the cavity of the laser.

15. A system comprising:
an external cavity tunable laser; and
a silicon photonics circuit comprising one or more resonators having one or more p-i-n junctions; wherein a voltage is applied to one or more of the p-i-n junctions; using a reverse junction current to control power of the external cavity tunable laser using a control loop; wherein the control loop stabilizes laser temperature; wherein the reverse junction current serves as a feedback signal to enable the control loop to lock at least a resonator of the one or more resonators at a lasing wavelength.

16. The system of claim 15, wherein the p-i-n junction is reverse biased.

17. The system of claim 15, wherein a first resonator of the one or more resonators is a first crystal photonics resonator, and wherein the silicon photonics circuit further comprises a second resonator; wherein a second control loop controls a voltage applied to a p-i-n junction of the second resonator.

* * * * *